(12) United States Patent
Wei

(10) Patent No.: US 7,199,062 B2
(45) Date of Patent: Apr. 3, 2007

(54) METHOD FOR FORMING A RESIST FILM ON A SUBSTRATE HAVING NON-UNIFORM TOPOGRAPHY

(75) Inventor: Yayi Wei, Altamont, NY (US)

(73) Assignee: Infineon Technologies AG, Munich (DE)

( * ) Notice: Subject to any disclaimer, the term of this patent is extended or adjusted under 35 U.S.C. 154(b) by 178 days.

(21) Appl. No.: 11/098,181

(22) Filed: Apr. 4, 2005

(65) Prior Publication Data

US 2006/0223336 A1   Oct. 5, 2006

(51) Int. Cl.
 H01L 21/31 (2006.01)
(52) U.S. Cl. .................. 438/758; 438/760; 427/240; 257/E21.259
(58) Field of Classification Search ............... None
See application file for complete search history.

(56) References Cited

U.S. PATENT DOCUMENTS

| | | | |
|---|---|---|---|
| 4,027,686 A | 6/1977 | Shortes et al. |
| 4,741,926 A | 5/1988 | White et al. |
| 5,070,813 A | 12/1991 | Sakai et al. |
| 5,358,740 A | 10/1994 | Bornside et al. |
| 5,405,813 A | 4/1995 | Rodrigues |
| 5,555,902 A | 9/1996 | Menon |
| 5,677,001 A | 10/1997 | Wang et al. |
| 6,004,622 A | 12/1999 | Yen et al. |
| 6,251,487 B1 | 6/2001 | Yonaha |
| 6,559,215 B2 | 5/2003 | Mills et al. |
| 6,716,285 B1 | 4/2004 | Weyburne et al. |
| 6,849,293 B2 | 2/2005 | Rawat |

FOREIGN PATENT DOCUMENTS

JP   2001-143998   5/2001

*Primary Examiner*—Walter Lindsay, Jr.
*Assistant Examiner*—Kyoung Lee
(74) *Attorney, Agent, or Firm*—Slater & Matsil, L.L.P.

(57) ABSTRACT

A preferred embodiment of the invention provides a method of spin coating a liquid, such as a resist, onto a surface of a substrate. An embodiment of the invention comprises dispensing a liquid onto the surface; spinning the substrate at a first rotational velocity at least until the liquid forms a substantially uniform film on the surface of the substrate; and spinning the substrate at a second rotational velocity in an opposite direction at least until the liquid reforms a substantially uniform film on the surface of the substrate. Other embodiments include a first rotational acceleration for accelerating the substrate to the first rotational velocity, and a second rotational acceleration for accelerating the substrate to the second rotational velocity. Preferably, the second rotational acceleration is much larger than the first rotational acceleration. Still other embodiments include repeating the first velocity, second velocity sequence one or more times.

27 Claims, 3 Drawing Sheets

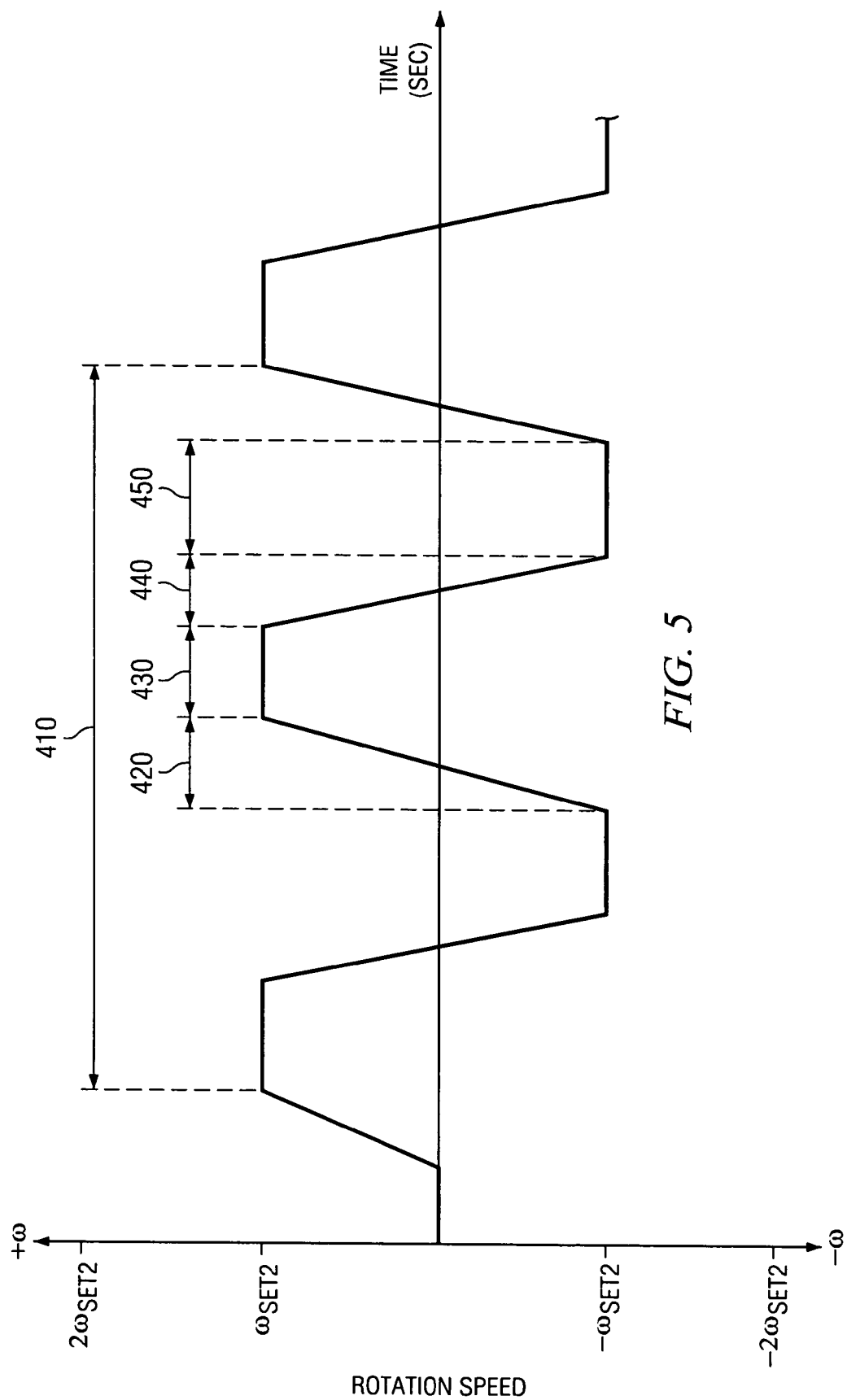

METHOD FOR FORMING A RESIST FILM ON A SUBSTRATE HAVING NON-UNIFORM TOPOGRAPHY

TECHNICAL FIELD

This invention relates generally to spin coating methods and, more particularly, to a method for forming a uniform film on a semiconductor wafer.

BACKGROUND

Spin coating is a common method for forming thin films on a surface. Spin coating applications include the manufacture of magnetic disks, lens coatings, reflectors, and liquid crystal displays, to name a few. In semiconductor manufacturing, the ability of spin coating to produce thin, uniform films makes this an important process. A particularly important semiconductor application includes forming thin resist films in photolithography. Continued developments in photolithography have enabled the miniaturization of integrated circuits (IC) and the corresponding improvements in device performance.

In a typical IC lithography process, a liquid resist is comprised of a nonvolatile material dissolved in a volatile solvent. The liquid resist is dispensed onto a spinning substrate, such as a wafer, typically near its center. As the wafer accelerates to its final spinning velocity, centrifugal forces cause much of the liquid to flow off the substrate surface. As liquid spins off the surface, the volatile solvent evaporates, thereby concentrating the nonvolatile material dissolved in the resist. Solvent evaporation and liquid spin off combine to reduce the thickness of the liquid film on the spinning wafer. As the liquid film becomes thinner, the viscous forces therein become increasingly dominant. Eventually, the viscous forces balance the centrifugal forces, thereby producing an extremely thin film on the surface of the wafer.

Two film properties of concern to workers in the semiconductor arts are film thickness and uniformity, as these correlate directly with lithography resolution. The processing parameters known to affect these include liquid viscosity, surface tension, solute and/or solid concentration, drying rate, gas flow above the wafer, and wafer rotation. Another important parameter affecting film quality is substrate surface topography.

Workers in the art are aware that surface topography may produce flow anomalies in the resist during spin coating. These anomalies may lead to resist accumulation on one side of the surface feature and depletion on the opposite side. These effects become more pronounced as the distance from the centrifugal center of the wafer increases. Furthermore, workers are aware that changing a single topographical feature can affect the thickness of the coating on adjacent features, particularly those situated outwardly from the altered feature on a line extending from the centrifugal center.

In light of problems such as these, there remains a need for improved methods for forming spin-coated films, particularly on substrates having a non-uniform surface topography.

SUMMARY OF THE INVENTION

These and other problems are generally solved or circumvented, and technical advantages are generally achieved, by preferred embodiments of the present invention that provides a spin coating method.

A preferred embodiment of the invention provides a method of spin coating a liquid, such as a resist, onto a surface of a substrate. The substrate may comprise, for example, a semiconductor wafer, an integrated circuit, or another semiconductor fabrication, preferably one having a non-uniform surface topography. By way of example, non-uniformities may include surface features having a height up to about 10 µm.

An embodiment of the invention comprises dispensing a liquid onto a surface of a substrate and spinning the substrate at a first rotational velocity. The substrate is preferably spun so that the liquid coats at least a portion of the surface. Embodiments further include spinning the substrate at a second rotational velocity, wherein the first and second rotational velocities are in opposite directions. Preferably, the substrate is spun at the second rotational velocity such that the liquid coats the surface of the substrate. In other embodiments, the substrate is spun at the first and second velocities at least until the liquid forms a substantially uniform film on the surface of the substrate.

In preferred embodiments, the liquid comprises a photoresist having a volatile and a non-volatile component. In other embodiments, the liquid comprises another type of resist, a spun-on dielectric or polymer.

In other embodiments, the spin coating method includes a first rotational acceleration for accelerating the substrate to the first rotational velocity, and a second rotational acceleration for accelerating the substrate to the second rotational velocity. Preferably, the second rotational acceleration is at greater than or equal to the first rotational acceleration.

In other embodiments, dispensing the liquid comprises spinning the substrate at a constant rotational velocity up to about 3000 rpm. Still other embodiments may comprise dispensing the liquid during an acceleration stage of the spin coating process.

Yet still other embodiments may further include repeating the rotational sequences. For example, such embodiments may comprise repeatedly accelerating the substrate to a first rotational velocity and accelerating the substrate to a second rotational velocity, thereby spinning the film back and forth on the surface a plurality of times.

In another embodiment, the second rotational velocity is at least twice the first rotational velocity, $\omega_2 > -2*\omega_1$. Preferably, the first and/or second rotational velocity is a predetermined velocity, which is derived from an experimentally determined, empirical relationship between film thickness and substrate rotation velocity.

Still another embodiment provides a method of semiconductor device fabrication. An embodiment includes dispensing a resist onto the surface while spinning the substrate at a first rotational velocity and spinning the substrate at a second rotational velocity. Preferably, the second rotational velocity is not equal to the first rotational velocity. Embodiments further include spinning the substrate at a third rotational velocity. Preferably, the third rotational velocity is in a direction opposite to the second rotational velocity. Conventional methods may complete the semiconductor fabrication. These may include baking the substrate to remove solvents until the resist is suitably hardened; and transferring a mask pattern onto the resist followed by exposing the resist film, and developing the resist film to form a pattern over the substrate. Embodiments may further include effecting the substrate using the mask pattern, wherein effecting the substrate comprises etching a layer of the substrate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a plot of wafer rotation velocity vs. time during spin coating according to an alternative embodiment.

Figure 1:
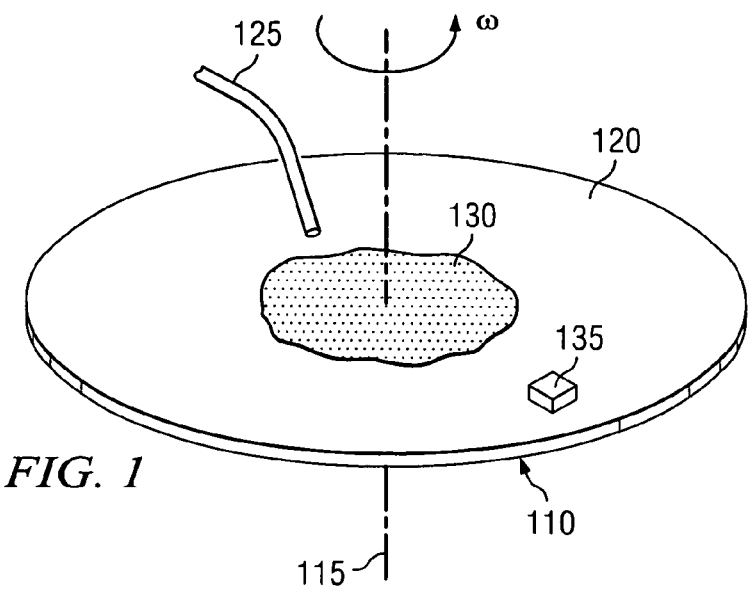
FIG. 1 is a perspective view illustrating resist dispensing during a spin coating process according to an embodiment of the invention.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter or symbol indicating variations of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts.

The present invention will now be described with respect to preferred embodiments in a specific context, namely a method for spin coating a surface of a semiconductor substrate, wherein the surface has a non-uniform topology. Preferred embodiments of the invention provide a method of forming a uniform photoresist film on the surface, although other embodiments provide a method of forming other films such as spun-on or flowable dielectrics. The flowable dielectric may include a spun-on glass (SOG), pentacene, and polyimide, for example. In other embodiments, a spun-on liquid may include, for example, a polymer used in the fabrication of polymer thin film transistors, wherein uniform polymer films are between about 100 and 10,000 nm thick. In still other embodiments, the spun-on liquid may include nano-sized particles.

Preferred embodiments use rotationally generated forces created by spinning the substrate to produce a homogeneous resist film having a thickness less than about 500 nm, and preferably between about 50 and 500 nm. The substrate preferably comprises a semiconductor wafer having a radius up to about 15 cm or larger. In a spin coating process, a chemical supply source dispenses a liquid, such as a photoresist, onto the surface of the wafer. Typically, the photoresist includes a non-volatile, polymeric resin dissolved or dispersed in a volatile solvent. The wafer is mounted on a rotatable chuck. An excess of the photoresist is dispensed through one or more nozzles positioned above the surface of the wafer, typically near or at its center. Upon spinning the wafer, centrifugal force drives the liquid across the surface towards the edge of the wafer. As the photoresist flows across the wafer in a thin film, the solvent evaporates, thereby making the film progressively more viscous towards the edge. After a suitable spinning period, the viscous force in the film balances rotational forces, thereby producing a film on the surface. Final film thickness depends on a number of factors including viscosity, solvent evaporation rate, percent solids, surface tension, rotation acceleration and velocity, and other spin processing parameters. A detailed discussion of spin coating transport theory is provided in U.S. Pat. No. 5,358,740 to D. E. Bomside et al., which application is hereby incorporated herein by reference in its entirety.

Embodiments of the invention are suitable for applications requiring highly uniform films. Embodiments are particularly advantageous when the surface of the wafer includes non-uniform topological features. Turning now to FIG. 1, there is illustrated a wafer 110 having a rotational axis 115 substantially perpendicular to the surface 120. The wafer is capable of being rotated, or spun, about the rotational axis 115 at an angular velocity, ω, wherein ω may be expressed in revolutions per minute (rpm). FIG. 1 further includes a single surface feature 135 to illustrate a gross simplification of a non-uniform topology of the surface 120. The non-uniform topology may include, by way of example, a semiconductor device, such as a transistor or a capacitor, at an intermediate stage of fabrication. Non-uniform topologies may also include recesses up to about 10 μm deep and may include such features as trenches and vias.

Before describing embodiments further, it is useful to comment on the convention used to describe substrate rotation. In keeping with nomenclature conventionally used within the spin coating art, rotational acceleration is expressed in rpm/second (rpm/s). Frequently, there is a need to distinguish between rotation directions, i.e., clockwise or counterclockwise. In such a situation, ω>0 arbitrarily represents counterclockwise rotation, such as illustrated in FIG. 1. Occasionally, as will be clear from the context, it is only necessary to speak of the magnitude of the rotational velocity; therefore, the +/− sign is not needed.

Continuing with FIG. 1, there is further illustrated a conventional liquid dispensing apparatus 125 for dispensing photoresist 130 onto the surface 120 of the wafer 110. Preferably, the photoresist 130 is dispensed at or near the center of substrate 110. In an embodiment, the resist comprises a commercially available photoresist, JSR ARX168J-15, which has a viscosity about 1.8 cP (0.018 gm/cm-sec) and is suitable for 193 nm photolithography. The total volume dispensed is preferably about 1.5 to 5 ml, depending on the wafer size. Other resists may include those useful at the deep ultra-violet range (DUV) of patterning such as a 150 nm thick resist at the 45 nm technology node.

Figure 2A:
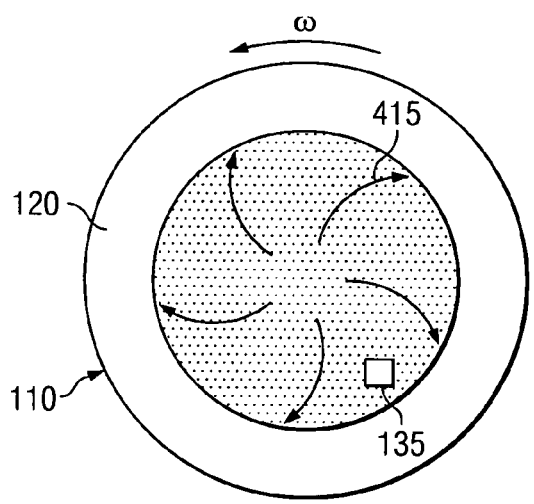
FIGS. 2A and 2B are plan views of a wafer illustrating a film flow pattern according to an embodiment.

Turning to FIG. 2A, there is a plan view of the wafer 110 of FIG. 1 after the photoresist has been dispensed and shortly after the wafer 110 has begun rotating at a constant angular velocity, ω. Shown in FIG. 2A are streamlines 415 that represent the convection flow pattern in a liquid film, the resist, as it is accelerated (spun up) to the wafer's rotational velocity. Initially, the liquid is at rest on the wafer. When the wafer rotated, shear forces drag the liquid along with the wafer. If rotated for a sufficiently long period, the liquid is fully spun up to the wafer's velocity, and the two rotate together substantially as if a rigid body.

Continuing with FIG. 2A, for a transient period, the liquid photoresist flows from the wafer center to its edge, as illustrated by the streamlines 415. One skilled in the art understands, however, that the actual liquid film convection pattern is a function of depth, radius, and time. Therefore, one understands that the convection streamline patterns used to illustrate this and other embodiments are not intended to represent an exact solution to the three dimensional, non-linear, time dependent Navier-Stokes equations of fluid momentum conservation. Rather, the streamlines 415 illustrate the general flow pattern as the liquid is spun up. That is, flow proceeds from a centrifugal center of the wafer towards the edge, substantially along a radial path. As is known in the art, this is the flow pattern that causes radial inhomogeneity during spin coating, and this is a problem solved by embodiments of the invention.

Figure 2B:
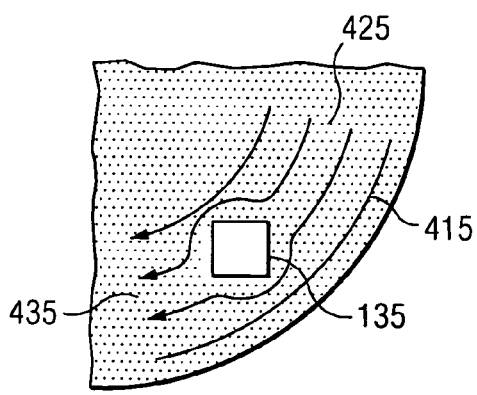

Turning now to FIG. 2B, there is illustrated an enlarged view of the surface feature 135 of FIG. 2A and the related flow around this feature. As shown in FIG. 2B, the streamlines 415 must flow past the surface feature 135 before reaching the edge of the wafer. This leads to radial inhomogeneity since there is essentially an upstream 425 and a downstream 435 flow region near the surface feature 135. In other words, the surface feature 135 shadows a region of the wafer, thereby causing a non-uniform spin coating. Typically, the non-uniformity comprises a partially depleted portion of the film in the downstream region 435 near the surface feature 135.

Figure 3A:
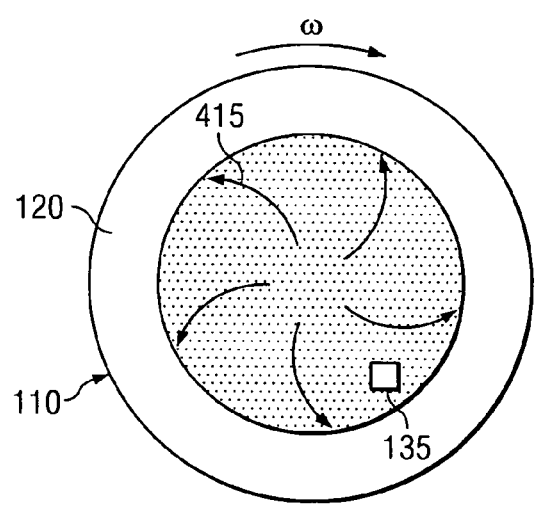
FIGS. 3A and 3B are plan views of a wafer illustrating a film flow pattern according to another embodiment.
Figure 3B:
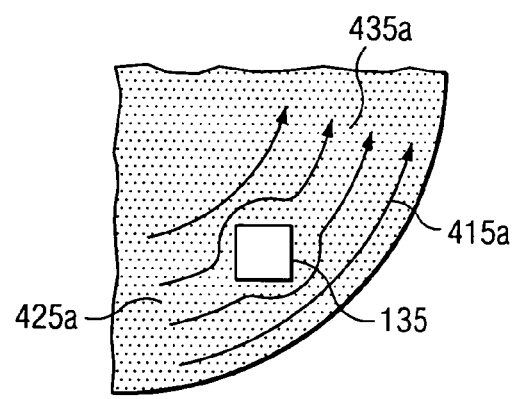

Turning now to FIG. 3A, there is illustrated a preferred embodiment of the invention that solves many inhomogeneity problems relating to non-uniform topologies. Specifically, before the liquid photoresist is cured or otherwise hardened, the wafer rotation is rapidly reversed, thereby reversing the shear forces acting on the liquid film. As shown in FIG. 3B, rotation reversal changes the orientation of the upstream 425a and downstream 435a regions relative to the surface feature 135, as qualitatively illustrated in FIG. 3B in comparison to FIG. 2B. As described below in connection with other embodiments of the invention, by adjusting such spin coating parameters as angular acceleration, rotation speed, rotation duration, and frequency of rotation reversal, it is possible to suitably remove coating inhomogeneities.

Figure 4:
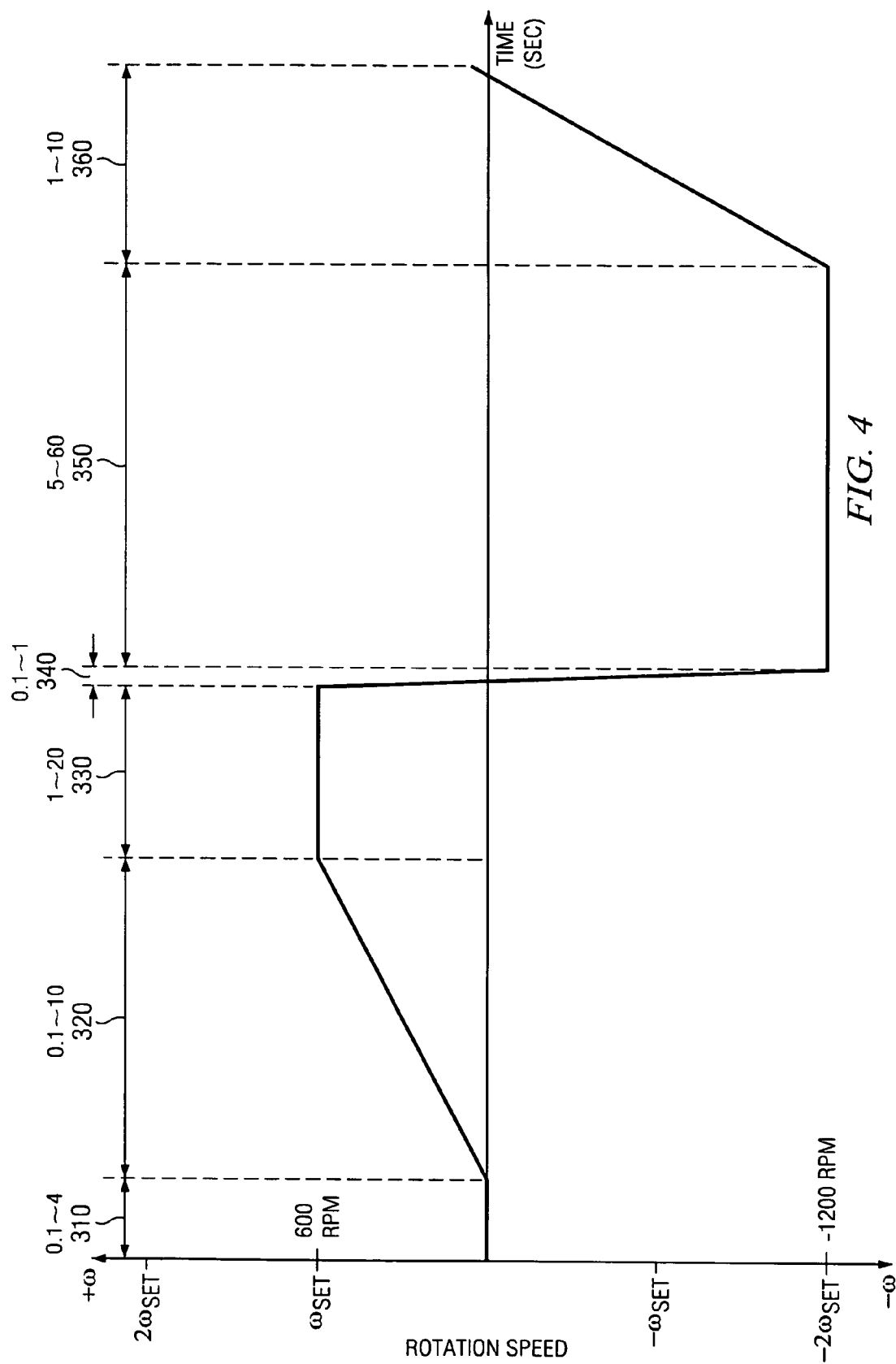
FIG. 4 is a plot of wafer rotation velocity vs. time during spin coating according to an embodiment.

Turning now to FIG. 4, there is a plot of a substrate rotation velocity vs. time for a preferred embodiment of the invention. As illustrated in FIG. 4, there is initially a resist dispensing period 310, the period having a duration between about 0.1 and 4 seconds. Preferably, the resist is dispensed at or near the center substrate while the wafer is stationary (0 rpm). Other embodiments (not illustrated) may include rotating the wafer during resist dispensing period 310, preferably between about 0 and 3000 rpm.

After the resist dispensing period 310, there follows a first acceleration period 320 lasting between about 0.1 and 10 seconds, wherein the wafer is spun up (accelerated) to a first rotation velocity, e.g., $\omega_{set}$=600 rpm. Preferably, the magnitude of the acceleration for the first acceleration period 320 is between about 100 and 1000 rpm/s. During the acceleration period, rotational shear forces acting on the fluid by the wafer rotate the fluid while centrifugal forces simultaneously drive the fluid towards the edge of the wafer.

After the wafer reaches its rotational set point, $\omega_{set}$, there follows a first period of constant rotation (i.e., constant angular velocity) 330. An objective of this stage of the spin coating process is to coat at least a portion of the surface of the substrate. The coating may comprise a substantially uniform film on the wafer. The substantially uniform film is largely, but not completely, uniform in that micro-sized and/or nano-sized film inhomogeneities are present. As described above, the inhomogeneities are caused by the non-uniform topology of the wafer. The duration of the first constant rotation period 330 is typically up to about 60 seconds and preferably between about 1 to 30 seconds.

Continuing with FIG. 4, following the first period of constant rotation 330, there follows a second acceleration period 340, wherein the rotation of the wafer is reversed. The magnitude of the second acceleration may be different than the first acceleration, but it is preferably equal. After the second acceleration period 340, there follows a second constant rotational velocity period 350, wherein the wafer is rotated in a direction opposite to the first rotation direction. Preferably, the magnitude of the second rotational velocity 350 is about twice the first rotational velocity, e.g., $\omega_2$=−2*$\omega_1$=−1,200 rpm, which may be suitable for a film having a target thickness of about 200 nm. The duration of the second rotational velocity period 350 may be longer than the first constant rotational period 330 and is preferably between about 5 and 60 sec. In an embodiment, the minimum duration of the second rotational velocity period 350 is for a time needed to coat the surface of the substrate. Preferably, the minimum duration of the second rotational velocity period 350 is for a substantially uniform film to form on the wafer. More preferably, the duration of the second rotational velocity period 350 is at least the time required to form a film lacking inhomogeneities caused by a non-uniform surface topology of the wafer.

Continuing still with FIG. 4, after the second period of constant rotation 350, there follows brief deceleration period 360, typically about 1 to 10 seconds, wherein the wafer rotation ceases. In other embodiments, the duration of acceleration/deceleration periods 320, 340, and 360 may be up to about 120 seconds.

Embodiments of the invention are not limited to a single rotation reversal as illustrated in FIG. 4. As illustrated by the rotation velocity vs. time plot in FIG. 5, embodiments of the invention may include a plurality of clockwise/counter-clockwise rotations 410. For example, such a plurality may include a rotation sequence comprising: a first acceleration period 420, a first constant rotation period 430, a second acceleration period 440, and a second constant velocity rotation period 450. The rotational velocities and accelerations may remain constant with time (as illustrated in FIG. 5), or they may independently change with time in response to film properties.

In other embodiments (not illustrated), the rotation scheme may include a stopping period (0 rpm), wherein the wafer remains stationary. For example, a wafer may be rotated in a clockwise direction at a constant velocity. It may thereafter be decelerated and stopped for a period. After a pause in rotation, it may then be accelerated to a suitable counterclockwise velocity. As in other embodiments, the rotation scheme may be repeated a plurality of times.

Still other embodiments may provide a method of spin coating a resist onto a surface of a substrate for forming a semiconductor device pattern. The wafer may include a round silicon wafer having a radius greater than about 5 or 10 cm, for example. The method may include dispensing about 1.5 to 5 ml of liquid resist, preferably a photoresist, onto the surface while spinning the wafer at a first rotational velocity. Preferably, the first rotational velocity is up to about 3,000 rpm. Preferred embodiments further include spinning the wafer at a second rotational velocity, wherein the second rotational velocity is greater than the first rotational velocity, the second rotational velocity preferably being between about 200 to 1000 rpm. Preferred embodiments further include spinning the wafer at a third rotational velocity, wherein the third rotational velocity is in a direction opposite the second rotational velocity. Preferably, the third rotational velocity is between about −200 to −2000 rpm. Other embodiments may further include repeating spinning the wafer at the second rotational velocity and at the third rotational velocity a plurality of times. Embodiments that comprise forming a semiconductor device pattern preferably include baking the wafer to remove solvents until the resist is suitably hardened and thereafter transferring a mask pattern onto the resist followed by exposing the resist film, and developing the resist film to form a pattern on the wafer.

Although the present invention and its advantages have been described in detail, it should be understood that various changes, substitutions and alterations may be made herein without departing from the spirit and scope of the invention. For example, the coating embodiments described herein are equally suitable for front end of the line (FEOL) or back end of the line (BEOL) processing. They are suitable for wafers, intermediate devices, finished devices, and other substrates not generally used in semiconductor manufacturing.

It will also be readily understood by those skilled in the art that materials and methods may be varied while remaining within the scope of the present invention. It is also appreciated that the present invention provides many applicable inventive concepts other than the specific contexts used to illustrate preferred embodiments. Accordingly, the appended claims are intended to include within their scope such processes, machines, manufacture, compositions of matter, means, methods, or steps.

What is claimed is:

1. A spin coating method comprising:
   dispensing a liquid onto a surface of a substrate;
   spinning the substrate at a first rotational velocity so that the liquid coats at least a portion of the surface of the substrate; and
   spinning the substrate at a second rotational velocity in an opposite direction to the first rotational velocity such that the liquid coats the surface of the substrate.

2. The method of claim 1, wherein dispensing the liquid comprises spinning the substrate at a constant rotational velocity up to about 3,000 rpm.

3. The method of claim 2, wherein the constant rotational velocity is maintained at least until the liquid wets substantially the entire surface.

4. The method of claim 2, wherein the constant rotational velocity is maintained for less than about 5 seconds.

5. The method of claim 1, wherein the substrate comprises a partially fabricated integrated circuit on a semiconductor wafer.

6. The method of claim 1, wherein the substrate comprises a semiconductor wafer having a radius greater than about 10 cm.

7. The method of claim 1, wherein the liquid comprises a photoresist.

8. The method of claim 1, wherein the liquid comprises a volatile component and a non-volatile component.

9. The method of claim 1, wherein the liquid comprises a flowable dielectric.

10. The method of claim 9, wherein the flowable dielectric comprises a material selected from the group consisting essentially of a spun-on glass (SOG), pentacene, and polyimide.

11. The method of claim 1, wherein the liquid comprises a material selected from the group consisting essentially of a polymer and nano-sized particles.

12. The method of claim 1, wherein,
    spinning the substrate at the first rotational velocity includes a first rotational acceleration for accelerating the substrate to the first rotational velocity, and
    spinning the substrate at the second rotational velocity includes a second rotational acceleration for accelerating the substrate to the second rotational velocity,
    wherein the second rotational acceleration is greater than or equal to the first rotational acceleration.

13. The method of claim 12, wherein the first rotational acceleration is about 1,000 rpm/sec.

14. The method of claim 12, wherein the first rotational acceleration has a duration between about 1 and 30 seconds.

15. The method of claim 12, wherein the second rotational acceleration has a duration between about 10 and 60 seconds.

16. The method of claim 1, further comprising:
    maintaining the first rotational velocity for a duration between about 1 to 30 seconds; and
    maintaining the second rotational velocity for a duration between about 5 to 60 seconds.

17. The method of claim 1, wherein a magnitude of the second rotational velocity is at least about twice a magnitude of the first rotational velocity.

18. The method of claim 1, wherein in the first and second rotational velocities are predetermined velocities derived from an empirical relationship between film thickness and substrate rotation velocity.

19. The method of claim 1, further comprising repeating spinning the substrate at a first rotational velocity and spinning the substrate at a second rotational velocity a plurality of times.

20. A method of making a semiconductor device, the method comprising:
    dispensing a resist onto a surface of a substrate while spinning the substrate at a first rotational velocity;
    spinning the substrate at a second rotational velocity, wherein the second rotational velocity is greater than the first rotational velocity;
    spinning the substrate at a third rotational velocity, wherein the third rotational velocity is in a direction opposite to the second rotational velocity;
    baking the substrate to remove solvents until the resist is suitably hardened;
    transferring a mask pattern onto the resist followed by exposing a resist film, and developing the resist film to form a pattern over the substrate; and
    effecting the substrate using the mask pattern.

21. The method of claim 20, wherein the first rotational velocity is up to about 3,000 rpm.

22. The method of claim 20, wherein the second rotational velocity is between about 100 and 1000 rpm.

23. The method of claim 20, wherein the third rotational velocity is between about −200 and −2000 rpm.

24. The method of claim 20, wherein the substrate comprises a semiconductor wafer.

25. The method of claim 20, wherein the resist comprises a liquid photoresist.

26. The method of claim 20, further comprising repeating spinning the substrate at a second rotational velocity, and spinning the substrate at a third rotational velocity a plurality of times.

27. The method of claim 20, wherein effecting the substrate comprises etching a layer of the substrate.

* * * * *